US010170330B2

(12) United States Patent
Ryan

(10) Patent No.: US 10,170,330 B2
(45) Date of Patent: Jan. 1, 2019

(54) METHOD FOR RECESSING A CARBON-DOPED LAYER OF A SEMICONDUCTOR STRUCTURE

(71) Applicant: GLOBALFOUNDRIES Inc., Grand Cayman (KY)

(72) Inventor: Errol Todd Ryan, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 7 days.

(21) Appl. No.: 14/812,046

(22) Filed: Jul. 29, 2015

(65) Prior Publication Data
US 2016/0163559 A1 Jun. 9, 2016

Related U.S. Application Data

(60) Provisional application No. 62/089,575, filed on Dec. 9, 2014.

(51) Int. Cl.
| | |
|---|---|
| *H01L 21/3105* | (2006.01) |
| *H01L 21/311* | (2006.01) |
| *H01L 29/06* | (2006.01) |
| *H01L 29/66* | (2006.01) |
| *H01L 29/78* | (2006.01) |
| *H01L 21/768* | (2006.01) |

(52) U.S. Cl.
CPC .... *H01L 21/3105* (2013.01); *H01L 21/31111* (2013.01); *H01L 21/31116* (2013.01); *H01L 21/76826* (2013.01); *H01L 29/0649* (2013.01); *H01L 29/66795* (2013.01); *H01L 29/7851* (2013.01)

(58) Field of Classification Search
CPC ......... H01L 21/31633; H01L 21/76825; H01L 21/76826; H01L 21/31111; H01L 21/31116
USPC ........................................................ 438/705
See application file for complete search history.

(56) References Cited

U.S. PATENT DOCUMENTS

2005/0074961 A1* 4/2005 Beyer ................... H01L 21/764
438/619
2010/0248485 A1* 9/2010 Block ................. H01L 21/3105
438/704

(Continued)

OTHER PUBLICATIONS

E. Todd Ryan et al, "Property Modifications of Nanoporous PSiCOH Dielectrics to Enhance Resistance to Plasma-Induced Damage", Journal of Applied Physics 104, 094109 (2008), 7 pages.

*Primary Examiner* — David Spalla
(74) *Attorney, Agent, or Firm* — Heslin Rothenberg Farley & Mesiti P.C.; Nathan B. Davis

(57) ABSTRACT

Semiconductor structure and methods of fabrication thereof are provided which includes, for instance, providing a carbon-doped material layer within a recess of a semiconductor structure; removing, in part, carbon from the carbon-doped material layer to obtain, at least in part, a carbon-depleted region thereof, the carbon-depleted region having a modified etch property with an increased etch rate compared to an etch rate of the carbon-doped material layer; and recessing the carbon-depleted region of the carbon-doped material layer by an etching process, with the carbon-depleted region being recessed based upon, in part, the modified etch property of the carbon-depleted region.

20 Claims, 6 Drawing Sheets

(56) References Cited

U.S. PATENT DOCUMENTS

| | | | |
|---|---|---|---|
| 2015/0200141 A1* | 7/2015 | Zhu | H01L 21/0223 257/401 |
| 2015/0262938 A1* | 9/2015 | Lin | H01L 23/53238 257/751 |
| 2016/0056156 A1* | 2/2016 | Ghani | H01L 21/823821 257/401 |

* cited by examiner

METHOD FOR RECESSING A CARBON-DOPED LAYER OF A SEMICONDUCTOR STRUCTURE

CROSS-REFERENCE TO RELATED APPLICATION

This application claims the benefit of U.S. Provisional Patent Application No. 62/089,575, filed Dec. 9, 2014, which is hereby incorporated herein by reference in its entirety.

BACKGROUND

In one aspect, an integrated circuit fabrication may typically involve several processing steps of patterning and etching to form the desired circuit structures. During each processing step, materials may, for instance, be deposited on or etched from a semiconductor wafer being processing. For instance, materials may be deposited on or within high aspect ratio openings, associated with various circuit features, for instance, isolation features, including shallow trench isolation regions, inter-layer dielectric features, inter-metal dielectric (IMD) features or pre-metal dielectric (PMD) features. As the size of technology nodes continues to decrease, significant challenges arise due (in part) to issues related to limitations of available fabrication techniques, including issues related to deposition and etching of material layers.

BRIEF SUMMARY

Certain shortcomings of the prior art are overcome and additional advantages are provided through the provision, in one aspect, of a method which includes, for instance, providing a carbon-doped material layer within a recess of a semiconductor structure; removing, in part, carbon from the carbon-doped material layer to obtain, at least in part, a carbon-depleted region thereof, the carbon-depleted region having a modified etch property with an increased etch property compared to an etch rate of the carbon-doped material layer; and recessing the carbon-depleted region of the carbon-doped material layer by an etching process, wherein the carbon-depleted region is recessed based upon, in part, the modified etch property thereof.

In a further aspect, a device is provided which includes, for instance, a semiconductor structure. The semiconductor structure includes, for instance, a carbon-doped isolation layer disposed adjacent to at least one sidewall of a fin structure extending above a substrate, the carbon-doped isolation layer including, at least in part, a carbon-depleted region having a modified etch property with an increased etch rate compared to an etch rate of the carbon-doped isolation layer. Further, the modified etch property of the carbon-depleted isolation region allows the carbon-doped isolation layer to be recessed down from an upper surface of the fin structure by an etching process.

In yet another aspect, a device is provided which includes, for instance, a semiconductor structure. The semiconductor structure includes, for instance, a carbon-doped dielectric layer disposed adjacent to at least one gate structure disposed above a substrate, the carbon-doped dielectric layer including, at least in part, a carbon-depleted dielectric region having a modified etch property with an increased etch rate compared to an etch rate of the carbon-doped dielectric layer. Further, the modified etch property of the carbon-depleted dielectric region allows the carbon-doped dielectric layer to be recessed down from an upper surface of the at least one gate structure by an etching process.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
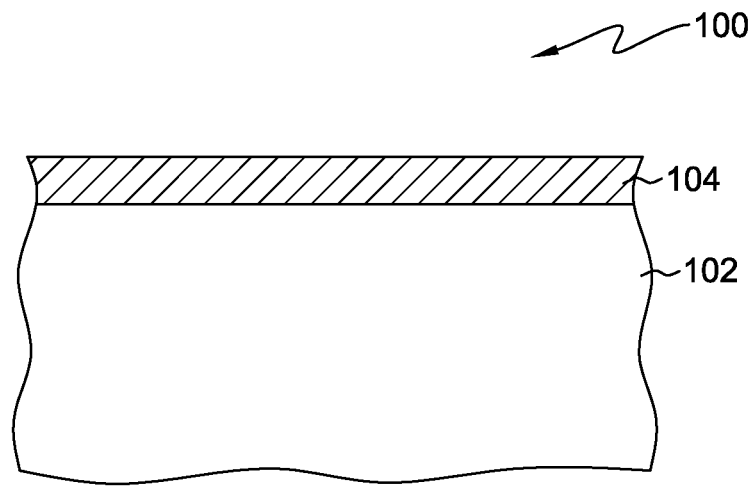
FIG. 1A is a cross-sectional elevational view of a structure obtained during a semiconductor structure fabrication process, in accordance with one or more aspects of the present invention.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

Disclosed herein, in part, is a method for recessing a carbon-doped material layer which may be used, for instance, in fabricating one or more semiconductor devices. In one aspect, the fabrication of semiconductor devices, during front-end-of line processing (FEOL), typically involves deposition of one or more material layers within high aspect ratio openings associated with various circuit features, for instance, isolation features and/or interlayer dielectric (ILD) features. In one example, material layer(s), for instance, isolation layer may be disposed within a substrate to define one or more isolation features so as to laterally isolate individual devices disposed within a chip or wafer. By way of example, the isolation features such as, for instance, a shallow trench isolation region or a deep trench isolation region, may be formed where the electrical isolation is desired, by patterning or etching one or more recesses within a substrate and disposing an isolation material within the recesses. In one example, the recessing of the substrate advantageously facilitates defining one or more fin structures or fin(s) which support the formation of three-dimensional finned semiconductor device(s). In this example, the layer of isolation material disposed between the fin(s) may be planarized to an upper surface of the fin(s) and subsequently recessed down from an upper surface of the fin(s) to expose the fin(s) for approximately a desired height thereof. One skilled in the art will know that the fin(s) may be used to form circuit elements having gate structures extending conformally over (and partially wrapping around the one or more fins) and active regions such as, for instance, source and drain regions, and channel regions separated by the source and drain region, while the isolation layer facilitates laterally isolating the fin(s) and the circuit elements formed therein from one another.

For instance, the isolation material disposed within the recess(es) in the semiconductor structure may include or be fabricated of a dielectric material such as, for instance, flowable oxide material, high-aspect ratio process (HARP) silicon dioxide or high-density plasma (HDP) silicon dioxide, and may be deposited using any of the conventional processes such as, for instance, chemical vapor deposition (CVD), thermal chemical vapor deposition (CVD) or plasma-enhanced chemical vapor deposition (PECVD) processes. In a specific example, chemical vapor deposition process may be employed using tetraethyl orthosilicate (TEOS) and ozone ($O_3$) as reactants to deposit the tetraethyl ortho based HARP-silicon dioxide within the recess(es). As the size of technology nodes transitions to 7 nanometers and below, significant challenges may continue to arise with the existing semiconductor fabrication processing techniques. For instance, the isolation layer may be deposited within the recess(es) utilizing, for instance, high-temperature annealing processes which could disadvantageously result in degrading the semiconductor material of the substrate. This, in turn, could impose undesirable limitations on the available semiconductor materials to be employed in a high-aspect ratio semiconductor fabrication processing. Additionally, the high-temperature annealing processes disadvantageously could degrade the isolation layer making it susceptible to subsequent wet/dry etch processing resulting in undesirable height variations during subsequent fabrication processing. These height variations could result in, for instance, pattern-loading effects across a chip or wafer which, in turn, could lead to reduced yield and greater overall fabrication costs.

In another aspect, during fabrication of semiconductor device gate structures, material layers such as, for instance, dielectric layers may also be disposed adjacent to one or more gate structure(s) to define one or more interlayer dielectric (ILD) features, which would later be replaced by contact metal, during subsequent fabrication processing. By way of example, the dielectric layers may include or be fabricated of dielectric materials such as, flowable oxide or high-aspect ratio process (HARP) oxide. However, the quality of conventional dielectric materials is typically poor, and may be vulnerable to subsequent wet/dry etch processing resulting in undesirable height variations of the resultant device(s). For instance, significant dielectric loss can occur if subsequent wet/dry etch processing is excessive.

As explained further below, the methods (and resultant semiconductor structures) disclosed herein address these challenges of existing material layers such as, for instance, isolation layers and/or dielectric layers, and thereby enhance the use of material layers, particularly in front-end of line (FEOL) and middle-of-line (MOL) processing of 7 nm, and below, technology nodes.

Generally stated, disclosed herein, in one aspect, is a method for recessing of a carbon-doped material layer, for instance, during front-end-of line (FEOL) processing of a semiconductor structure. The method includes, for instance: providing a carbon-doped material layer within a recess of a semiconductor structure; removing, in part, carbon from the carbon-doped material layer to obtain, at least in part, a carbon-depleted region of the carbon-doped material layer, the carbon-depleted region having a modified etch property with an increased etch rate compared to an etch rate of the carbon-doped material layer; and recessing the carbon-depleted region of the carbon-doped material layer by an etching process, with the carbon-depleted region being recessed based upon, in part, the modified etch property of the carbon-depleted region.

By way of example, the removing, in part, carbon from the carbon-doped material layer may include subjecting the carbon-doped material layer to remote plasma which includes, for instance an oxidizing plasma species or a reducing plasma species, to facilitate removing, in part, carbon from the carbon-doped material layer. In one example, the oxidizing plasma species may include or be fabricated of an oxygen-containing process gas such as, for instance, oxygen ($O_2$), carbon dioxide ($CO_2$) or ozone ($O_3$). In another example, the reducing plasma species may include or be fabricated of a hydrogen-containing process gas such as, for example, hydrogen ($H_2$) or ammonia ($NH_3$) gases.

In one aspect, the subjecting may include subjecting the carbon-doped material layer to the remote plasma using a plasma exposure duration which facilitates removing, in part, carbon to a desired depth within the carbon-doped material layer, with the plasma exposure duration being selected to control a desired depth of the carbon-depleted region of the carbon-doped material layer. In a specific example, the plasma exposure duration, for which the carbon-doped material layer is exposed to remote plasma, may be within a range of about 1 to 120 secs, while the carbon-depleted region of the carbon-doped material layer may have the desired depth within a range of about 2 to 200 nm.

In another aspect, the subjecting may include subjecting the carbon-doped material layer to the remote plasma using an exposure cycle time which facilitates controlling a percentage of the carbon being removed from the carbon-doped material layer, with the exposure cycle time being selected to inhibit degradation of the carbon-doped material layer. The modified etch property of the carbon-depleted region may be preferentially susceptible to an etching process which may be or include, for instance, a fluorine-containing etching processes. The recessing may include recessing the carbon-depleted region and stopping on the carbon-doped material layer, with the recessing of the carbon-doped material layer being inhibited by the presence of carbon disposed within the carbon-doped material layer which, for instance, may be preferentially be resistant to, for instance, a fluorine-containing etching process.

In one embodiment, the carbon-doped material layer may include a carbon-doped isolation layer, with the carbon-doped isolation layer being disposed adjacent to at least one sidewall of a fin structure extending above a substrate. The method may further include, for instance, removing, in part, carbon from the carbon-doped isolation layer to obtain, at least in part, a carbon-depleted isolation region of the carbon-doped isolation layer. Further, the carbon-depleted isolation region being recessed down from an upper surface of the fin structure using, in part, a modified etch property of the carbon-depleted isolation region. The removing may include, for instance, subjecting the carbon-doped isolation layer to remote plasma to facilitate removing, in part, the carbon from the carbon-doped isolation layer.

In another embodiment, the carbon-doped material layer may include a carbon-doped dielectric layer being disposed adjacent to at least one gate structure of the semiconductor structure. The method, in this embodiment may further include removing, in part, carbon from the carbon-doped dielectric layer to obtain, at least in part, a carbon-depleted dielectric region of the carbon-doped dielectric layer. Further, the carbon-depleted dielectric region has been recessed down from an upper surface of the at least one gate structure using, in part, a modified etch property of the carbon-depleted dielectric region. The removing may include, for instance, subjecting the carbon-doped dielectric layer to remote plasma to facilitate removing, in part, the carbon from the the carbon-doped dielectric layer.

Reference is made below to the drawings, which are not drawn to scale for ease of understanding, wherein the same reference numbers used throughout different figures designate the same or similar components.

FIGS. 1A-1H depict one example of an enhanced method for recessing a carbon-doped isolation layer for use, for instance, in fabricating one or more semiconductor structures. Advantageously, as described below, the carbon-doped isolation layer which, for instance, facilitates laterally isolating one or more fin structures, may be recessed selectively by removing, in part, carbon from the carbon-doped isolation layer using, for instance, remote plasma, in accordance with one or more aspects of the present invention.

FIG. 1A is a cross-sectional elevational view of a structure 100 obtained during one embodiment of a method for fabricating a semiconductor structure such as, for instance, a planar semiconductor structure or a finned semiconductor structure. In the example shown, structure 100 includes a substrate 102, such as a semiconductor substrate. For example, substrate 102 may be a bulk semiconductor material such as a bulk silicon wafer. As another example, substrate 102 may include or be a silicon-containing substrate including, but not limited to, silicon (Si), single crystal Si, polycrystalline Si, amorphous Si, silicon-on-nothing (SON), silicon-on-insulator (SOI), or silicon-on-replacement insulator (SRI) substrate or the like. Substrate 102 may in addition or instead include various isolations, dopings and/or device features. For instance, substrate 102 may include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb).

A layer of protective material 104 may be disposed over substrate 102. In one example, protective material 104 may be or include a nitride material such as, for instance, silicon nitride (SiN or $Si_3N_4$), or silicon oxynitride (SiON). By way of example, protective material 104, having a thickness of about 30 to 50 nm, may be deposited over a silicon substrate 102 using any conventional deposition process, such as chemical vapor deposition (CVD), physical vapor deposition (PVD), atomic layer deposition (ALD) or plasma-enhanced versions of the same. Protective material 104 may be provided to protect the underlying silicon substrate from damage during subsequent etch processes, and depending on the fabrication process, may also prevent silicon substrate 102 from being oxidized by exposure to an oxygen-containing environment during device fabrication.

Figure 1B:
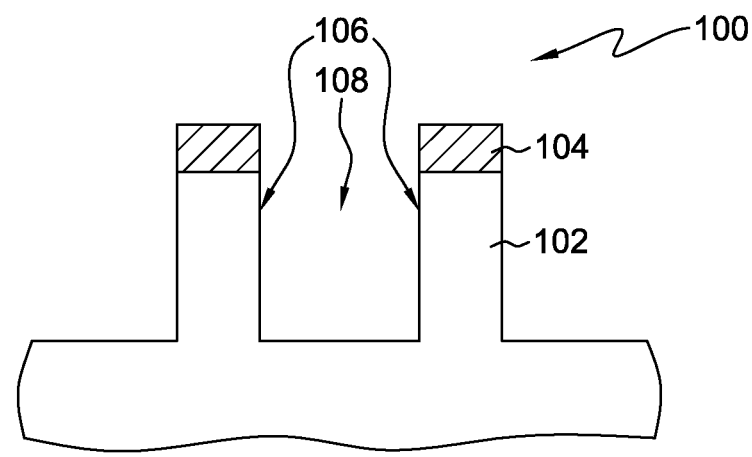
FIG. 1B depicts the structure of FIG. 1A, after forming one or more fin structure(s), in accordance with one or more aspects of the present invention.

As depicted in FIG. 1B, one or more fins 106 are formed extending from substrate 102. By way of example, fins 106 may be formed by removing one or more portions of substrate 102, creating openings 108 therein, to define one or more fins 106 from the same material as the substrate, such as, for example, a silicon semiconductor material. In one example, formation of fins 106 may be achieved by patterning the protective material 104 and substrate 102 using any of various approaches, including: direct lithography; sidewall image transfer technique; extreme ultraviolet technique (EUV); e-beam technique; litho-etch litho-etch; or litho-etch litho-freeze. Following patterning, the removal may be performed by any suitable etching process, such as an anisotropic dry etching process, for instance, reactive ion etching (RIE) in sulfur hexafluoride ($SF_6$). In one example, adjacent fins 206 may be separated by a respective opening 208. Although the following numbers are relative and fin heights could vary, as one specific example, a fin 106 may have a height in the range of about 30 to 45 nm.

Figure 1C:
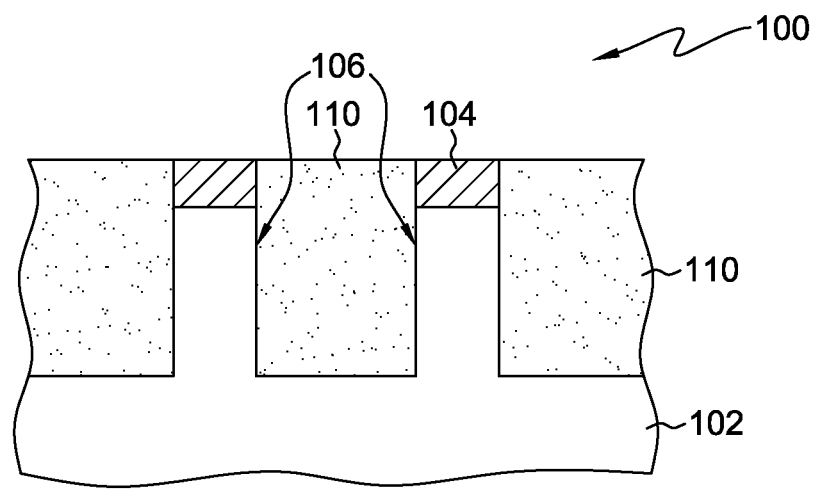
FIG. 1C depicts the structure of FIG. 1B after providing a carbon-doped isolation layer over the fin structure(s) and planarizing the carbon-doped isolation material to an upper surface of the protective material over the fin structure(s), in accordance with one or more aspects of the present invention.

FIG. 1C depicts the structure of FIG. 1B after the spaces between fins 106 have been filled with a layer of isolation material 110. Isolation material 110, in one example, may include or be fabricated of a carbon-doped material layer such as, for instance, organosilicate glass (OSG) or carbon-doped oxides, and may be deposited using a variety of techniques such as, for instance, spin-coating, chemical vapor deposition(CVD), plasma-enhanced CVD (PECVD) or sub-atmospheric pressure thermal CVD (SACVD) processes. The thickness of the isolation material/layer 110 may be (in one example) sufficient to allow subsequent planarization of the structure, for instance, to expose an upper surface of the protective material over the fins. By way of example, the carbon-doped isolation layer may include or be fabricated using an organosilane precursor material such as, for instance, tetramethylsilane (4MS), trimethylsilane (3MS), dimethylsilane (2MS) or monomethylsilane (MS), dimethyldimethoxysilane, octamethylcyclotetrasiloxane, and 1,2,5,7-tetramethyl cyclotetrasiloxane. In a specific example, the carbon-doped isolation layer may be disposed using, for instance, an organosilane precursor such as, trimethylsilane (3MS) and an oxygen-containing process gas such as, for instance, nitrous oxide ($N_2O$) in presence of inert gases, for instance, helium (He), argon (Ar), or nitrogen ($N_2$). In this example, the amount of carbon disposed within the carbon-doped isolation layer may be within a range of about 5 to 50%.

As noted, in one embodiment, the carbon atoms have been incorporated within carbon-doped isolation layer 110 as methyl ($CH_3$) groups forming methyl-silyl (Si—$CH_3$) linkages which, for instance, interrupt Si—O—Si network of a conventional cross-linked oxide material, such as, for instance, a flowable oxide material. In this embodiment, the carbon has been designed to inhibit or resist undesirable etching of the isolation layer to any of the subsequent wet/dry etching processes, during subsequent fabrication processing. Additionally, the carbon disposed therein may further contribute to lowering of the dielectric constant of the resultant isolation layer. In one example, the dielectric constant of carbon-doped isolation layer 110 may be within a range of about 2.7 to 3.0.

Figure 1D:
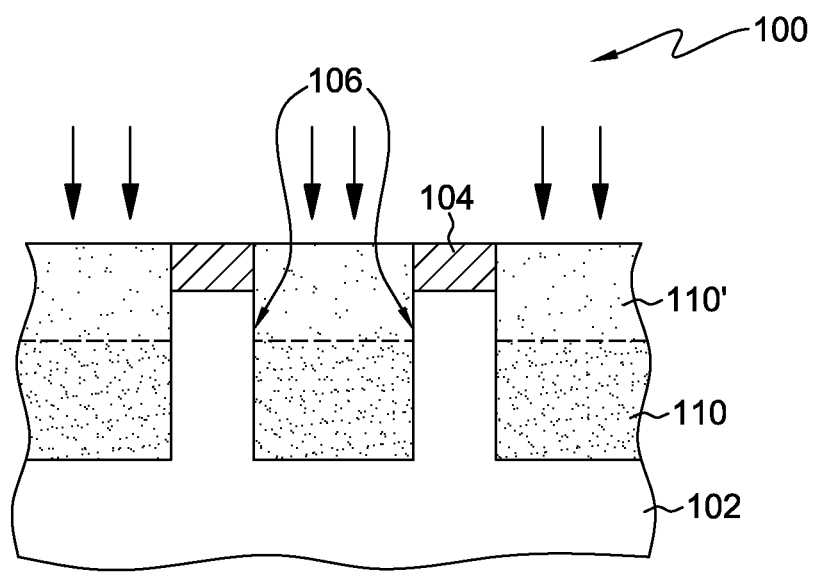
FIG. 1D depicts the structure of FIG. 1C after subjecting the carbon-doped isolation layer to remote plasma to obtain, at least in part, a carbon-depleted isolation region thereof, in accordance with one or more aspects of the present invention.

FIG. 1D depicts the structure of FIG. 1C after subjecting carbon-doped isolation layer 110 to remote plasma to facilitate removing, in part, carbon disposed within the carbon-doped isolation layer. In one example, carbon-doped isolation layer 110 may be subjected to the remote plasma treatment utilizing, for instance, an oxidizing plasma species to facilitate removing, in part, carbon disposed therein resulting in, at least in part, carbon-depleted isolation region 110' within the carbon-doped isolation layer. By way of example, the oxidizing plasma species may include or be fabricated of an oxygen-containing species such as, for example, oxygen ($O_2$), ozone ($O_3$) carbon monoxide (CO), nitrous oxide ($N_2O$) or carbon dioxide ($CO_2$). In another example, carbon-doped isolation layer 110 may also be subjected to a remote plasma treatment utilizing, for instance, a reducing plasma species to facilitate removing, in part, carbon disposed therein resulting in, at least in part, carbon-depleted isolation region 110'. In this example, the reducing plasma species may include or be fabricated of a hydrogen-containing species such as, for example, hydrogen ($H_2$) or ammonia ($NH_3$). In yet another example, carbon-doped isolation layer 110 may also be subjected to a plasma-less process that simultaneously exposes the carbon-doped isolation layer to process gases such as, for instance oxygen and ultraviolet light.

By way of example, the carbon disposed within carbon-doped isolation layer 110 may be removed by subjecting the isolation layer to remote plasma in presence of process gases such as, oxygen, during which the plasma dissociates, for instance, the methyl-silyl (Si—$CH_3$) linkages into corresponding silyl radicals and methyl radicals. The silyl radicals may react further, for instance, with the process gases of the oxidizing plasma species and/or reducing plasma species to form silanol (Si—OH) groups or silane (Si—H) groups, while the methyl radicals may be removed as volatile by-product materials resulting in carbon-depleted region 110'. In one example, the remote plasma treatment may be performed at an elevated temperature of about 25° to 400° C. in the presence of oxidizing plasma species such as, oxygen, having a pressure of about 1 to 700 Torr. In this embodiment, the semiconductor material of fins 106 remains unaffected during the remote plasma treatment, owing to protective layer 104 disposed over upper surfaces of fins.

In one embodiment, the removing of the carbon from carbon-doped isolation layer 110 via, for instance, remote plasma may be accomplished by controlling process parameters such as, for instance, chemistry of the plasma being employed, plasma power, plasma exposure duration and/or flow rate of the plasma species, so as to facilitate controlling a depth of the carbon being removed from the carbon-doped isolation layer. For instance, controlling plasma exposure duration of each individual plasma pulse facilitates controlling a depth of the carbon atoms being removed to achieve a desired depth of carbon-depleted isolation region 110' which, in one example, may be within a range of about 2 to 200 nm, depending on the process parameters and technology nodes employed. In this example, although the duration of the plasma exposure may depend on the process parameters and the process tool employed, plasma exposure duration for which the carbon-doped material layer is exposed to remote plasma may be within a range of about 1 to 120 sec. As understood, in an alternate example, the depth of the carbon being removed from the carbon-doped isolation layer to obtain carbon-depleted region 110', upon exposure to plasma-less process may also depend on the exposure duration. Further, percentage of carbon content being removed from the carbon-doped isolation layer 110 may also depend on process parameters such as, for instance, plasma exposure cycle time, as well as material properties of the isolation layer such as, for instance, density, chemical composition, porosity and/or pore microstructure of the carbon-doped isolation layer. For instance, the plasma exposure cycle time being employed facilitates determining percentage of carbon being removed from the carbon-doped isolation layer without degrading the carbon-doped isolation layer.

Figure 1E:
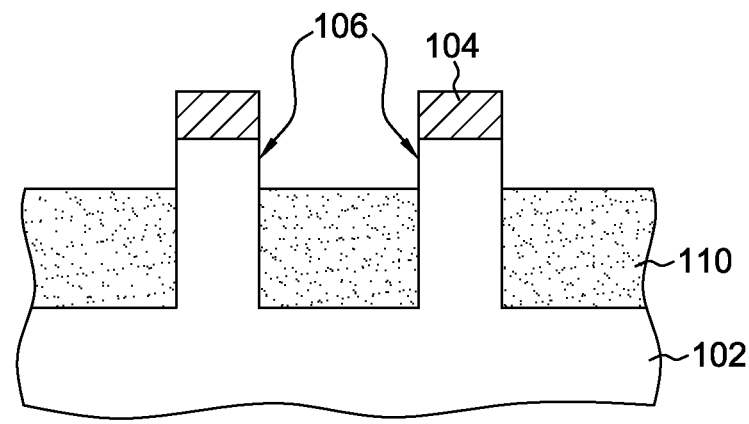
FIG. 1E depicts the structure of FIG. 1D with the carbon-depleted isolation region having been recessed down from the upper surface of the fin structure(s), in accordance with one or more aspects of the present invention.

As depicted in FIG. 1E, one or more etch processes are performed to recess carbon-depleted isolation region 110' (FIG. 1D), for instance, down from upper surfaces of fins 106, in accordance with one or more aspects of the present invention. By way of example, carbon-depleted isolation region 110' (FIG. 1D) may be selectively etched using conventional isotropic wet etching processes by employing suitable fluorine-containing etching chemistries such as, for instance, dilute hydrofluoric acid (HF/$H_2O$), or nitrogen trifluoride ($NF_3$). In a specific example, the dilute HF wet etch processing may be performed using, for instance, 1:300 HF/$H_2O$ dilution at 25° C. As noted above, carbon disposed within carbon-doped isolation layer 110 inhibits or prevents undesirable etching of the isolation layer. After exposure to remote plasma described in association with FIG. 1D, the absence of carbon from carbon-depleted isolation region 110'(FIG. 1D) facilitates preferentially modifying the etch property of the carbon-depleted isolation region 110' (FIG. 1D) compared to that of the underlying carbon-doped isolation layer 110.

Modification of the etch property means that a material that would have previously been resistant to etching under specific process parameters, for example, a specific etchant chemistry, may no longer be resistant to etching, and therefore may be removed during the etch process using that chemistry. For example, the absence of carbon facilitates modifying the etch property of carbon-depleted isolation region 110' (FIG. 1D) making it preferentially susceptible to wet/dry etching processes and in particular, fluorine-containing etching chemistries. As noted, the etch-rate of etchant chemistry, for instance, fluorine-containing etching chemistries is dependent upon the content of carbon present within the carbon-doped isolation layer. For example, the etch-rate of the fluorine-containing etchants decreases or minimizes as the content of carbon increases. This, in turn, facilitates selectively removing carbon-depleted isolation region 110' (FIG. 1D) and stopping on the carbon-doping isolation layer 110, using, the carbon disposed within the carbon-doped isolation layer as an etch-stop. Further, the absence of carbon within the carbon-depleted isolation region 110' (FIG. 1D), while being present within the underlying carbon-doped isolation layer 110 facilitates controlling the recessing of the carbon-depleted region selective to that of the carbon-doped isolation layer for a desired uniform height of the fins, thereby preventing or inhibiting pattern-loading effects of the resultant device(s). In another example, carbon-depleted isolation region 110'(FIG. 1D) may also be selectively etched using conventional anisotropic or isotropic dry etching processes such as, reactive ion etching or plasma ashing processes, COR or Siconi etch processes. Although the height of carbon-doped isolation layer 110 being recessed depends on the technology nodes and the process parameters employed, in one example, carbon-doped isolation layer 110 may be recessed to a height of about 5% to 75% of a height of fins 106.

Figure 1F:
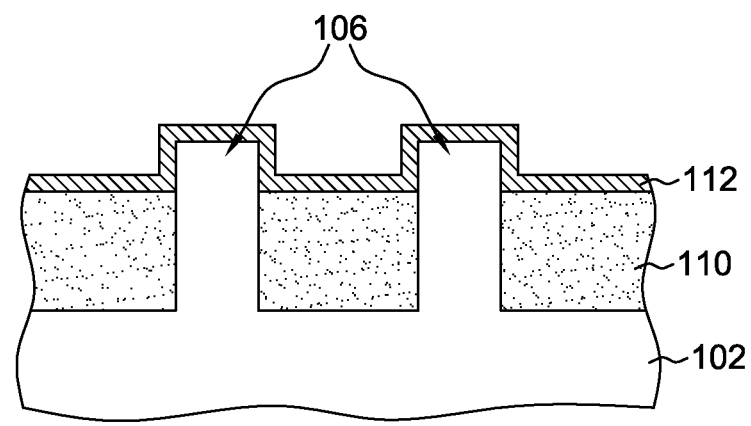
FIG. 1F depicts the structure of FIG. 1E after provision of a conformal oxide layer over the fin structure(s), in accordance with one or more aspects of the present invention.

FIG. 1F depicts the structure of FIG. 1E after removal of protective material 104 (FIG. 1E) and provision of a conformal oxide layer 112 over the exposed regions of the structure. Protective material 104 may be selectively removed via, for instance, a non-selective chemical mechanical polish or an etch-back polish, using the upper surfaces of fins 106, as an etch stop. Conformal oxide layer 112 may be provided over the exposed portions of fins 106 and over carbon-doped isolation layer 110. In one embodiment, conformal oxide layer 120 may include or be fabricated as a thin oxide material, having a uniform thickness, and may be deposited using any conventional deposition process such as, for instance, chemical vapor deposition, plasma-enhanced CVD process, or an in-situ steam growth (ISSG) process.

Figure 1G:
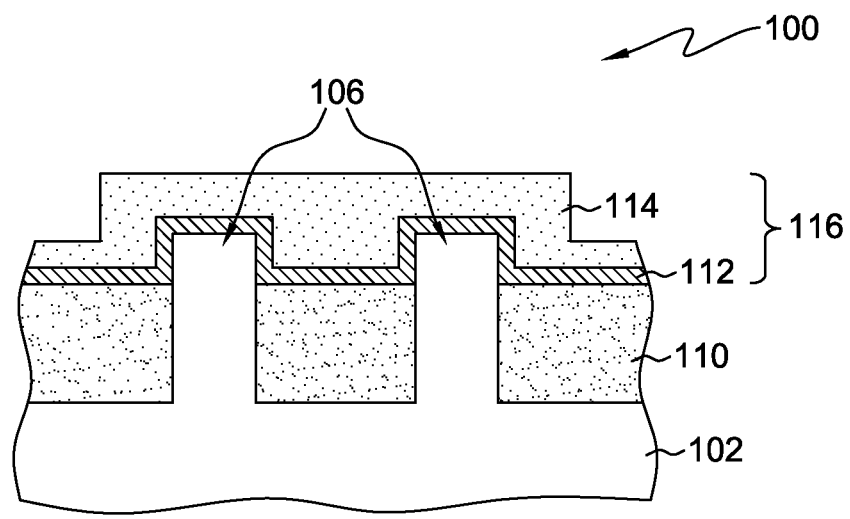
FIG. 1G depicts the structure of FIG. 1F with a gate material having been provided over the fin structure(s), in accordance with one or more aspects of the present invention.
Figure 1H:
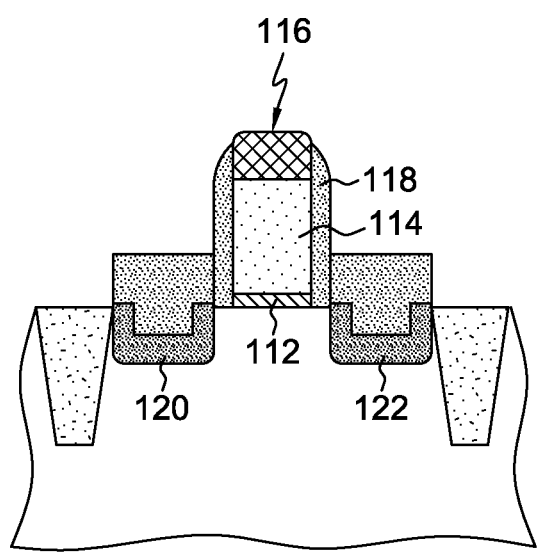
FIG. 1H depicts a transverse view of a resultant semiconductor structure obtained from further processing of the structure of FIG. 1G, where the carbon-depleted isolation region has been recessed down from the upper surface of the fin structure(s), in accordance with one or more aspects of the present invention.

FIG. 1G depicts the structure of FIG. 1F with gate material 114 may next be provided over conformal oxide layer 112 to form a gate structure 116. In one embodiment, gate material 114 may include or be fabricated of a metal, and be formed as part of a gate-first fabrication process. Alternatively, in another embodiment, gate material 114 may include or be a sacrificial gate material, such as amorphous silicon (a-Si) or polycrystalline silicon (polysilicon), which may subsequently be replaced with a replacement gate material, as part of a gate-last fabrication process FIG. 1H depicts a transverse view of the structure of FIG. 1G with the fabrication process having proceeded further to form a source region 120 and a drain region 122, followed by sidewall spacers 118 along the sidewalls of gate structure 116, as illustrated. Note that, in this example, carbon-doped isolation layer 110 has been selectively recessed to a desired uniform height of the fin(s), thereby preventing or inhibiting pattern-loading effect of the resultant device(s). By way of example, source region 120 and drain region 122 may be formed using any suitable techniques, including, for example, ion implantation and/or epitaxial growth of embedded source/drain materials. High temperature annealing may be performed to activate the source and drain regions, with the balance of the finned semiconductor device being formed, in one example, using a conventional process flow, including providing device contacts to the gate structure, source region and the drain region of finned semiconductor device.

FIGS. 2A-2D depict one embodiment of an enhanced, gate structure fabrication process for use, for instance, in fabricating one or more semiconductor structures. Advantageously, as described below, the carbon-doped dielectric layer disposed adjacent to one or more gate structures, may be recessed selectively by removing, in part, carbon from the carbon-doped dielectric layer using, for instance, remote plasma, in accordance with one or more aspects of the present invention.

Figure 2A:
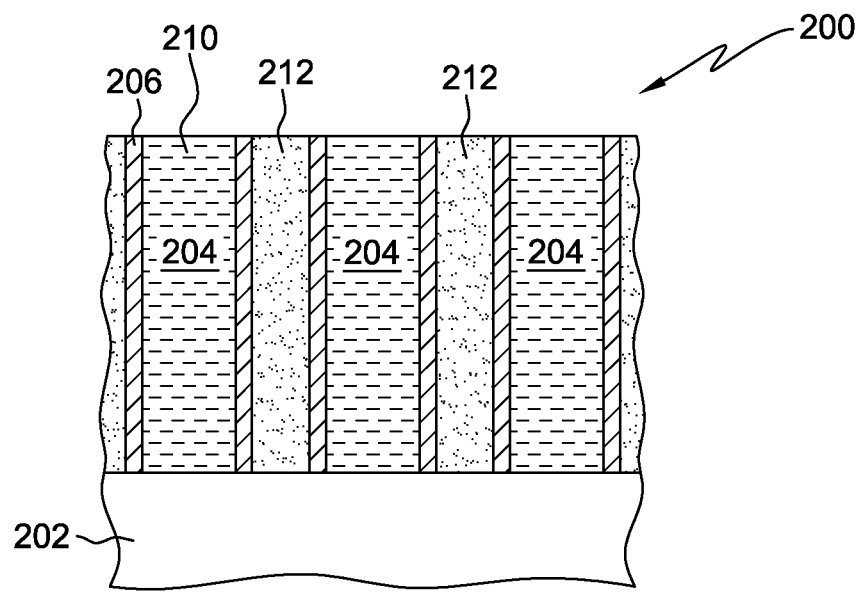
FIG. 2A is a cross-sectional elevational view of another structure obtained during a semiconductor structure fabrication process, in accordance with one or more aspects of the present invention.

FIG. 2A is a cross-sectional elevational view of a structure 200 obtained during another embodiment of a method for fabricating a semiconductor structure such as a planar semiconductor structure or a finned semiconductor structure. In the illustrated example, substrate 202, which may be a semiconductor substrate, is provided, along with one or more gate structure(s) 204. In one example, substrate 202 may be or include a semiconductor material, such as described above in connection with FIG. 1A. By way of example, gate structure(s) 204 may be sacrificial gate structures for use in a gate-last process, in which gate structures are provided after establishment of the source region and the drain region of the semiconductor structure. In one embodiment, gate structure(s) 204 includes, by way of example only, a sacrificial gate material 210 (such as polysilicon) and sidewall spacers 206 (formed, for example, from an oxide material). If desired, a gate cap (not shown) may be provided over sacrificial gate material 210. In another embodiment, gate structure 210 could be a gate structure of a typical gate-first process, in which gate structures are provided before establishment of the source and drain regions of the structure. In such a case, the sacrificial gate material would be replaced by one or more gate metals disposed above a gate dielectric, both of which may be surrounded or protected by sidewalls spacers 206.

Continuing with FIG. 2A, dielectric layer 212 may be disposed adjacent to one or more gate structures 204 which, for instance, would later be replaced by contact metal, during subsequent fabrication processing. The material of dielectric layer 212 may be similar or identical to the material of isolation layer 110, and may be formed using any of the deposition processes described for providing isolation layer 110, with respect to FIG. 1C. Briefly, the dielectric layer 212 may include or be fabricated of a carbon-doped material such as, for instance, organosilicate glass (OSG) or carbon-doped oxides. In this example, the amount of carbon disposed within the carbon-doped dielectric layer may be within a range of about 5 to 50%. The thickness of the dielectric layer may be (in one example) sufficient to allow subsequent planarization of the structure. As discussed above, the carbon disposed within carbon-doped dielectric layer 212 has been designed to inhibit or resist undesirable etching of the dielectric layer to any of the subsequent wet/dry etching processes, during subsequent fabrication processing.

Figure 2B:
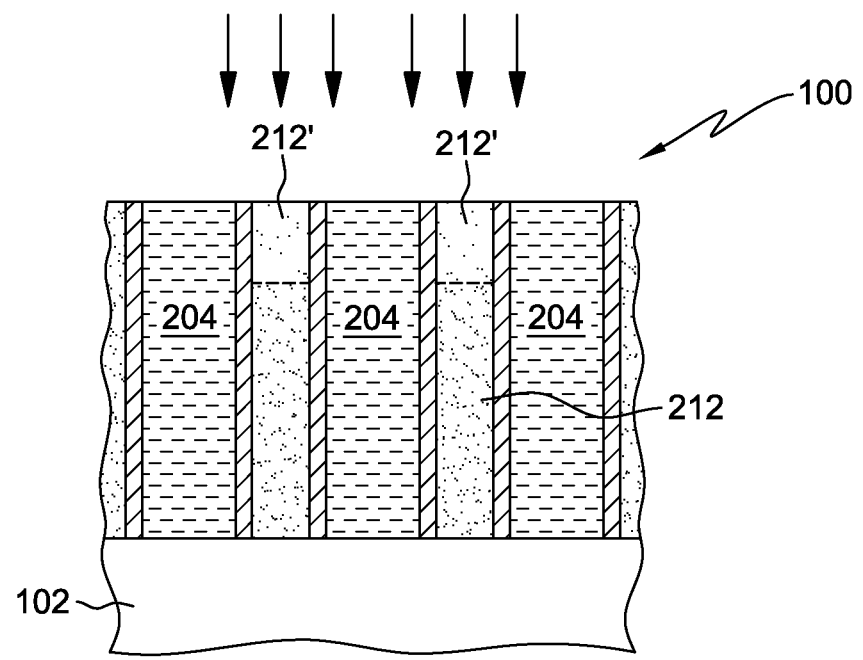
FIG. 2B depicts the structure of FIG. 2A after subjecting the carbon-doped dielectric layer to remote plasma to obtain, at least in part, a carbon-depleted dielectric region thereof, in accordance with one or more aspects of the present invention.

FIG. 2B depicts the structure of FIG. 2A after subjecting carbon-doped dielectric layer 212 to remote plasma to facilitate removing, in part, carbon disposed within the carbon-doped dielectric layer. The removing of the carbon from the carbon-doped dielectric layer 212 may be accomplished utilizing, in part, the remote plasma process described for removing carbon from the carbon-doped isolation layer 110 with respect to FIG. 1D. As depicted and described above, the removing of the carbon from carbon-doped dielectric layer 212 results in forming, at least in part, a carbon-depleted dielectric region 212'. Although the depth of carbon-depleted dielectric region 212' may be dependent upon the technology nodes and the process parameters employed, in one example, the depth of the carbon-depleted dielectric region 212' may be within a range of about 20 to 60 nm. Further, as discussed above in connection with FIG. 1D, the absence of carbon from the carbon-depleted dielectric region 212' selective to that of the carbon-doped dielectric layer 212 facilitates selectively modifying an etch property of the carbon-depleted dielectric region 212' compared to that of the carbon-doped dielectric layer 212. For instance, the absence of carbon from the carbon-depleted dielectric region 212' facilitates making it susceptible to wet/dry etching processes by enhancing its etch rate under specific process parameters, while the presence of carbon from the carbon-doped dielectric layer 212 facilitates making it resistant to etching processes using that chemistry.

Figure 2C:
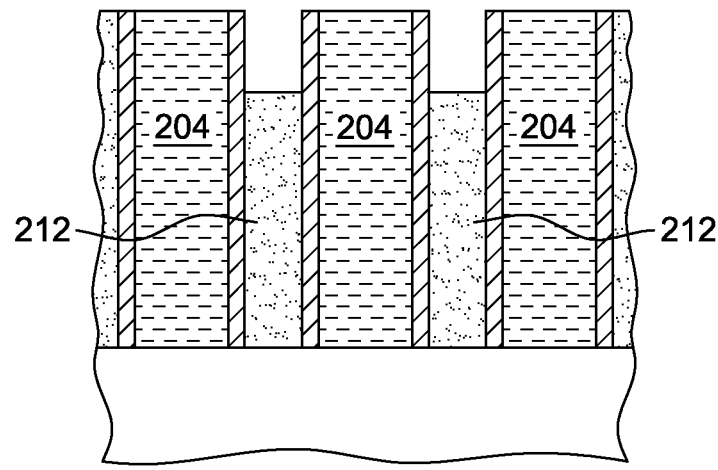
FIG. 2C depicts the structure of FIG. 2B with the carbon-depleted dielectric region having been recessed down from the upper surface of the gate structure(s), in accordance with one or more aspects of the present invention.

FIG. 2C depicts the structure of FIG. 2B with carbon-depleted dielectric region 212' (FIG. 2B) having been recessed down from the upper surface of gate structure(s) 204, in accordance with one or more aspects of the present invention. The recessing of carbon-depleted dielectric region 212' (FIG. 2B) may be accomplished utilizing, in part, one or more conventional isotropic wet etching processes or anisotropic dry etching processes such as, reactive ion etching or plasma ashing processes described for recessing carbon-depleted isolation region 110' (FIG. 1D) with respect to FIG. 1E. As depicted and described above, the recessing of the carbon-depleted dielectric region 212' (FIG. 2B) may preferentially be susceptible to wet etching processes employing suitable fluorine-containing etching chemistries such as, for instance, dilute hydrofluoric acid (HF/$H_2O$) or nitrogen trifluoride ($NF_3$), to facilitate etching the carbon-depleted dielectric region, and stopping on carbon-doped dielectric layer 212. Although the height of the carbon-doped dielectric layer 212 being recessed depends on the technology nodes and the process parameters employed, in one example, carbon-doped dielectric layer 212 may be recessed to a height of about 20 to 80% of a height of gate structure(s) 204.

Figure 2D:
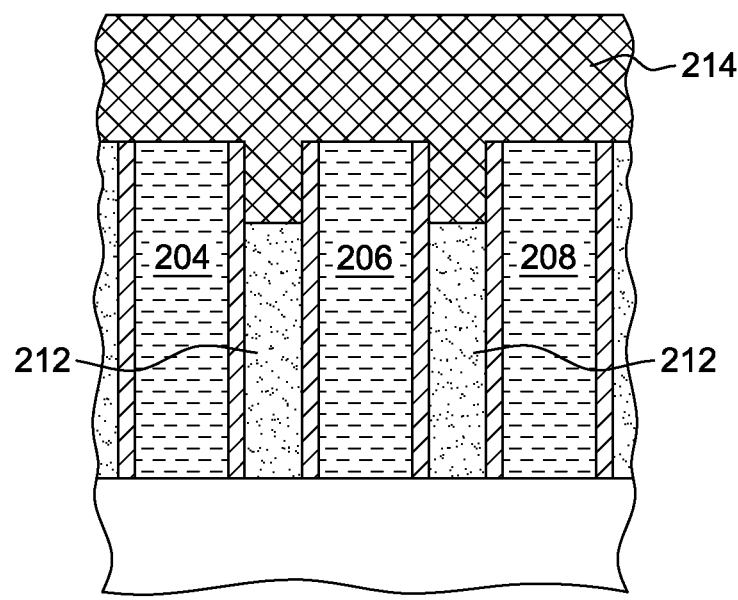
FIG. 2D depicts the structure of FIG. 2C with an additional dielectric layer having been provided over the carbon-doped dielectric layer, in accordance with one or more aspects of the present invention.

FIG. 2D depicts the structure of FIG. 2C with an additional dielectric layer 214 been provided over carbon-doped dielectric layer 212, in accordance with one or more aspects of the present invention. This additional dielectric layer 214 may include or be fabricated of an oxide material such as, for instance, high-density plasma (HDP) oxide and may be deposited using a variety of techniques such as, for example, chemical vapor deposition (CVD), plasma-enhanced CVD or sub-atmospheric pressure thermal CVD (SACVD) processes. The thickness of the additional dielectric layer may be (in one example) sufficient to allow for subsequent planarization of the structure.

Those skilled in the art will note that, advantageously, the methods and resultant semiconductor devices disclosed herein enhance the use of carbon-doped material layers such as, for instance, carbon-doped isolation layer and/or carbon-doped dielectric layer, particularly in front-end of line (FEOL) and middle-of-line (MOL) processing of 7 nm and below technology nodes. In one embodiment, the recessing of the carbon-doped material layers may be selectively controlled by removing, in part, carbon from the carbon-doped material layers using, for instance, remote plasma to obtain a carbon-depleted region with a modified etch property and subsequently recessing the carbon-depleted region by an etching process using, for instance, the modified etch property of the carbon-depleted region.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
providing a carbon-doped material layer within a recess of a semiconductor structure;
removing, in part, carbon from the carbon-doped material layer to obtain, at least in part, a carbon-depleted region thereof, the carbon-depleted region having a modified etch property with an increased etch rate compared to an etch rate of the carbon-doped material layer, wherein the removing comprises subjecting the carbon-doped material layer to remote plasma to facilitate removing, in part, carbon therefrom, and wherein the remote plasma comprises ozone; and
recessing the carbon-depleted region of the carbon-doped material layer by an etching process, wherein the carbon-depleted region is recessed based upon, in part, the modified etch property thereof, leaving a portion of the carbon-doped material layer in a horizontal layer, adjacent to and contacting at least one vertical structure, the vertical structure including, at least in part, silicon.

2. The method of claim 1, wherein the subjecting comprises subjecting the carbon-doped material layer to the remote plasma using a plasma exposure duration which facilitates removing, in part, carbon to a desired depth within the carbon-doped material layer, and wherein the plasma exposure duration is selected to control a desired depth of the carbon-depleted region thereof.

3. The method of claim 2, wherein the plasma exposure duration is within a range of about 1 to 120 seconds.

4. The method of claim 2, wherein the carbon-depleted region of the carbon-doped material layer has the desired depth within a range of about 2 to 200 nanometers.

5. The method of claim 1, wherein the subjecting comprising subjecting the carbon-doped material layer to the remote plasma using an exposure cycle time which facilitates controlling a percentage of the carbon being removed from the carbon-doped material layer, wherein the exposure cycle time is selected to inhibit degradation of the carbon-doped material layer.

6. The method of claim 1, wherein the modified etch property of the carbon-depleted region being preferentially susceptible to an etching process, the etching process being a fluorine-containing etching process.

7. The method of claim 1, wherein the recessing comprises recessing the carbon-depleted region and stopping on the carbon-doped material layer, the recessing of the carbon-doped material layer being inhibited by the presence of carbon disposed therein.

8. The method of claim 7, wherein the carbon-doped material layer being preferentially resistant to an etching process, the etching process being a fluorine-containing etching process.

9. The method of claim 1, wherein the carbon-doped material layer comprises a carbon-doped isolation layer, the carbon-doped isolation layer being disposed adjacent to at least one sidewall of a fin structure, and wherein the method further comprises removing, in part, carbon from the carbon-doped isolation layer to obtain, at least in part, a carbon-depleted isolation region thereof.

10. The method of claim 9, further comprising recessing the carbon-depleted isolation region down from an upper surface of the fin structure using, in part, a modified etch property thereof.

11. The method of claim 9, wherein the removing comprises subjecting the carbon-doped isolation layer to remote plasma to facilitate removing, in part, the carbon therefrom.

12. The method of claim 1, wherein the carbon-doped material layer comprises a carbon-doped dielectric layer, the carbon-doped dielectric layer being disposed adjacent to at least one gate structure of the structure, and wherein the method further comprises removing, in part, carbon from the carbon-doped dielectric layer to obtain, at least in part, a carbon-depleted dielectric region thereof.

13. The method of claim 12, further comprising recessing the carbon-depleted dielectric region down from an upper surface of the at least one gate structure using, in part, a modified etch property thereof.

14. The method of claim 12, wherein the removing comprises subjecting the carbon-doped dielectric layer to remote plasma to facilitate removing, in part, the carbon therefrom.

15. The method of claim 1, further comprising:
depositing a conformal oxide layer over the carbon-doped material layer and the at least one vertical structure.

16. The method of claim 15, further comprising:
providing a gate material over the conformal oxide layer.

17. The method of claim 16, wherein the gate material comprises a metal.

18. The method of claim 16, wherein the gate material comprises silicon.

19. The method of claim 18, wherein the silicon comprises amorphous silicon or polycrystalline silicon.

20. The method of claim 15, further comprising:
forming a source region and a drain region; and
forming a set of sidewall spacers between both the source region and the gate material and drain region and the gate material.

* * * * *